(12) United States Patent
Do et al.

(10) Patent No.: US 10,580,859 B2
(45) Date of Patent: Mar. 3, 2020

(54) NANOROD PRODUCTION METHOD AND NANOROD PRODUCED THEREBY

(71) Applicant: SAMSUNG DISPLAY CO., LTD., Yongin-si, Gyeonggi-do (KR)

(72) Inventors: Young Rag Do, Seoul (KR); Yeon Goog Sung, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/077,316

(22) PCT Filed: Feb. 24, 2017

(86) PCT No.: PCT/KR2017/002053
§ 371 (c)(1),
(2) Date: Aug. 10, 2018

(87) PCT Pub. No.: WO2017/150848
PCT Pub. Date: Sep. 8, 2017

(65) Prior Publication Data
US 2019/0051724 A1    Feb. 14, 2019

(30) Foreign Application Priority Data

Feb. 29, 2016   (KR) .................. 10-2016-0024610

(51) Int. Cl.
*H01L 21/26* (2006.01)
*H01L 21/324* (2006.01)
(Continued)

(52) U.S. Cl.
CPC .......... *H01L 29/0669* (2013.01); *B82Y 40/00* (2013.01); *H01L 21/02* (2013.01);
(Continued)

(58) Field of Classification Search
CPC ... H01L 21/02; H01L 21/2007; H01L 21/205; H01L 21/204; H01L 29/0669; B82Y 40/00
(Continued)

(56) References Cited

U.S. PATENT DOCUMENTS

2006/0116002 A1*  6/2006  Kalkhoran ............. B82Y 10/00
                                                 438/798
2011/0309382 A1* 12/2011  Lowgren ................ B82Y 20/00
                                                 257/88
(Continued)

FOREIGN PATENT DOCUMENTS

CN    105241476 A  *  1/2016
CN    105241476 A     1/2016
(Continued)

OTHER PUBLICATIONS

Extended European Search for corresponding European Patent Application No. 17760252.1, dated Jun. 26, 2019, 7 pages.

*Primary Examiner* — David S Blum
(74) *Attorney, Agent, or Firm* — Lewis Roca Rothgerber Christie LLP

(57) ABSTRACT

Provided is a method of manufacturing a nanorod. The method comprising comprises the steps of: providing a growth substrate and a support substrate; epitaxially growing a nanomaterial layer onto one surface of the growth substrate; forming a sacrificial layer on one surface of the support substrate; bonding the nanomaterial layer with the sacrificial layer; separating the growth substrate from the nanomaterial layer; flattening the nanomaterial layer; forming a nanorod by etching the nanomaterial layer; and separating the nanorod by removing the sacrificial layer.

13 Claims, 2 Drawing Sheets

(51) Int. Cl.

| | |
|---|---|
| *H01L 21/42* | (2006.01) |
| *H01L 21/477* | (2006.01) |
| *H01L 29/06* | (2006.01) |
| *H01L 21/306* | (2006.01) |
| *H01L 21/02* | (2006.01) |
| *H01L 21/3063* | (2006.01) |
| *H01L 29/41* | (2006.01) |
| *H01L 21/304* | (2006.01) |
| *H01L 21/205* | (2006.01) |
| *H01L 21/20* | (2006.01) |
| *B82Y 40/00* | (2011.01) |
| *H01L 21/762* | (2006.01) |

(52) U.S. Cl.
CPC ........ *H01L 21/205* (2013.01); *H01L 21/2007* (2013.01); *H01L 21/304* (2013.01); *H01L 21/306* (2013.01); *H01L 21/3063* (2013.01); *H01L 21/76251* (2013.01); *H01L 29/06* (2013.01); *H01L 29/41* (2013.01)

(58) Field of Classification Search
USPC .......................................................... 438/796
See application file for complete search history.

(56) References Cited

U.S. PATENT DOCUMENTS

| | | |
|---|---|---|
| 2013/0048945 A1 | 2/2013 | Fang et al. |
| 2014/0175372 A1* | 6/2014 | berg ................ H01L 31/022466 |
| | | 257/9 |
| 2017/0062213 A1* | 3/2017 | Patolsky ............... H01L 29/775 |

FOREIGN PATENT DOCUMENTS

| | | | |
|---|---|---|---|
| JP | 2015-164792 A | | 9/2015 |
| KR | 10-2010-0024874 A | | 3/2010 |
| KR | 10-2010-0025838 A | | 3/2010 |
| KR | 10-2011-0105641 A | | 9/2011 |
| KR | 10-1403091 B1 | | 7/2014 |
| KR | 10-2015-0116345 A | | 10/2015 |
| KR | 20150116345 A | * | 10/2015 |

* cited by examiner

NANOROD PRODUCTION METHOD AND NANOROD PRODUCED THEREBY

TECHNICAL FIELD

The present invention relates to a method of manufacturing a nanorod and a nanorod produced thereby.

BACKGROUND ART

A nanorod is a nano-sized structure having a diameter in the range of several tens of nanometers to several hundreds of nanometers and a large aspect ratio, and a device employing the nanorod is used in various fields such as a field effect transistor (FET), a field emission device (FED), a light emitting diode (LED), a solar cell, a gas sensor, a chemical sensor, a biosensor, and the like according to applications.

A synthesis of the nanorod may be broadly divided into two methods: a vapor method using a vapor-liquid-solid (VLS) mechanism employing a metal catalyst and a liquid method using a solution.

The vapor method is a method such that a state of a material is changed into a gaseous state using high heat, and atoms in the gaseous state condense to synthesize nanorods of various shapes. The vapor method makes it difficult to control sizes and properties of nanorods and to uniformly arrange the synthesized nanorods.

Further, a crystal structure and an optical characteristic of a nanorod, which is produced by the liquid method, are poor due to a large number of defects, as compared to the nanorod synthesized by the vapor method, and similar to the vapor method, there is a problem in that arrangement and formation of electrodes are difficult.

Conventional methods of producing a nanorod include chemical polymerization, electrochemical polymerization, chemical vapor deposition (CVD), and carbothermal reduction, but the conventional methods have many restrictions which require a high synthesis temperature, a reaction time, expensive vacuum equipment, the use of a harmful gas, and the like in order to obtain a high-quality nanorod.

Further, a surface crack may occur in a conventional process of separating a nanorod from a substrate, and damage and thermal damage may be caused by strong heat energy and heat transfer.

DISCLOSURE

Technical Problem

The present invention is directed to providing a nanorod production method capable of minimizing a defective rate of a nanorod and producing a high quality nanorod, and a nanorod produced thereby.

Technical Solution

One aspect of the present invention provides a nanorod production method including providing a growth substrate and a support substrate, epitaxial growing a nanomaterial layer on one surface of the growth substrate, forming a sacrificial layer on one surface of the support substrate, bonding the nanomaterial layer to the sacrificial layer, separating the growth substrate from the nanomaterial layer, flattening the nanomaterial layer, etching the nanomaterial layer to form a nanorod, and separating the nanorod by removing the sacrificial layer.

The growth substrate may include at least one among a glass substrate, a quartz substrate, a sapphire substrate, a plastic substrate, and a bendable flexible polymer film.

The growth substrate may include at least one among gallium nitride (GaN), silicon carbide (SiC), zinc oxide (ZnO), silicon (Si), gallium phosphide (GaP), spinel (MgAl2O4), magnesium oxide (MgO), lithium aluminate (LiAlO2), lithium gallate (LiGaO2), gallium arsenide (GaAs), aluminum nitride (AlN), indium phosphide (InP), and copper (Cu).

The support substrate may include at least one among the sapphire substrate, the glass substrate, a silicon carbide substrate, a silicon substrate, and a conductive substrate made of a metal material.

The nanomaterial layer may include at least one among ZnO, GaN, GaAs, SiC, tin oxide (SnO2), GaP, InP, zinc selenide (ZnSe), molybdenum disulfide (MoS2), and Si.

The nanomaterial layer may be epitaxially grown by metal organic chemical vapor deposition (MOCVD).

The epitaxial growing of the nanomaterial layer on one surface of the growth substrate may include controlling a length of the nanorod by adjusting a deposition thickness of the nanomaterial layer.

The sacrificial layer may include an insulating layer for bonding to the nanomaterial layer and a metal layer deposited on an upper surface of the insulating layer to bond the insulating layer.

The sacrificial layer may be made of gold (Au), titanium (Ti), iron (Fe), silicon oxide (SiO2), or silicon nitride (SiN).

The separating of the growth substrate from the nanomaterial layer may include separating the growth substrate from the nanomaterial layer using one among a laser lift-off (LLO) method, a chemical lift-off (CLO) method, and an electrochemical lift-off (ELO) method.

The flattening of the nanomaterial layer may include flattening the nanomaterial layer separated from the growth substrate using chemical mechanical polishing (CMP).

When the sacrificial layer is made of SiO2, the separating of the nanorod by removing the sacrificial layer may include removing the sacrificial layer using a buffered oxide etchant (BOE).

When the sacrificial layer is made of a metal layer, the separating of the nanorod by removing the sacrificial layer may include removing the sacrificial layer using a metal etchant.

Another aspect of the present invention provides a nanorod produced by the above-described nanorod production method.

Advantageous Effects

A method of manufacturing a nanorod and a nanorod produced thereby, according to an exemplary embodiment of the present invention, include a sacrificial layer such that a defective rate of a nanorod can be minimized by easily separating the nanorod during a process of separating the nanorod from a support substrate, thereby producing a high quality nanorod.

MODES OF THE INVENTION

Figure 1:
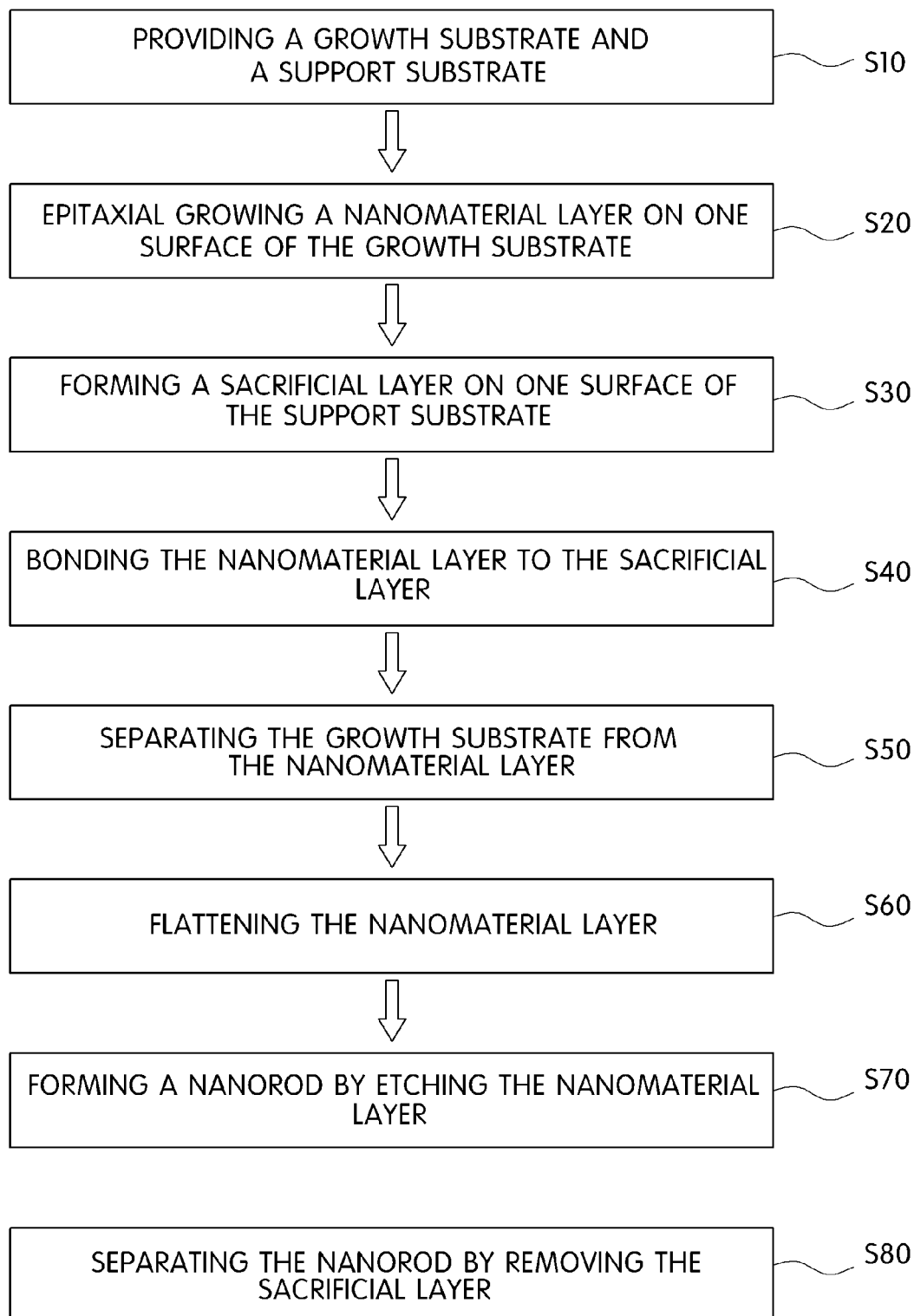
FIG. 1 is a flowchart illustrating a nanorod production method according to one embodiment of the present invention.

Hereinafter, embodiments of the present invention will be fully described in detail which is suitable for easy implementation by those skilled in the art to which the present invention pertains with reference to the accompanying drawings. The present invention may be implemented in various different forms, and thus it is not limited to embodiments which will be described herein. In the drawings, some portions not related to the description will be omitted and not be shown in order to clearly describe the present invention, and the same reference numerals are given to the same or similar components throughout this disclosure.

In this description, the terms "comprising," "including," "having," or the like are used to specify that a feature, a number, a step, an operation, a component, an element, or a combination thereof described herein exists, and it should be understood that they do not preclude the presence or addition probability of one or more other features, numbers, steps, operations, components, elements, or combinations thereof in advance. Further, when a portion of a layer, a film, a region, a plate, or the like is referred to as being "on" another portion, this includes not only a case in which the portion is "directly on" another portion but also a case in which yet another portion is present between the portion and another portion. Contrarily, when a portion of a layer, a film, a region, a plate, or the like is referred to as being "under" another portion, this includes not only a case in which the portion is "directly under" another portion but also a case in which yet another portion is present between the portion and another portion.

Hereinafter, a nanorod production method and a nanorod produced thereby according to one embodiment of the present invention will be described in detail with reference to the drawings.

FIG. 1 is a flowchart illustrating a method of manufacturing a nanorod according to one embodiment of the present invention. FIGS. 2A to 2G are cross-sectional views sequentially illustrating a process of producing a nanorod using the method of manufacturing a nanorod according to one embodiment of the present invention.

Referring to FIG. 1, the method of manufacturing a nanorod may include providing a growth substrate and a support substrate (S10), epitaxial growing a nanomaterial layer on one surface of the growth substrate (S20), forming a sacrificial layer on one surface of the support substrate (S30), bonding the nanomaterial layer to the sacrificial layer (S40), separating the growth substrate from the nanomaterial layer (S50), flattening the nanomaterial layer (S60), forming a nanorod by etching the nanomaterial layer (S70), and separating the nanorod by removing the sacrificial layer (S80).

Accordingly, the method of manufacturing a nanorod according to one embodiment of the present invention is capable of minimizing a defective rate of a nanorod, which is caused by a process of separating a nanorod 1 from a support substrate 13, and producing a high quality nanorod.

Figure 2:
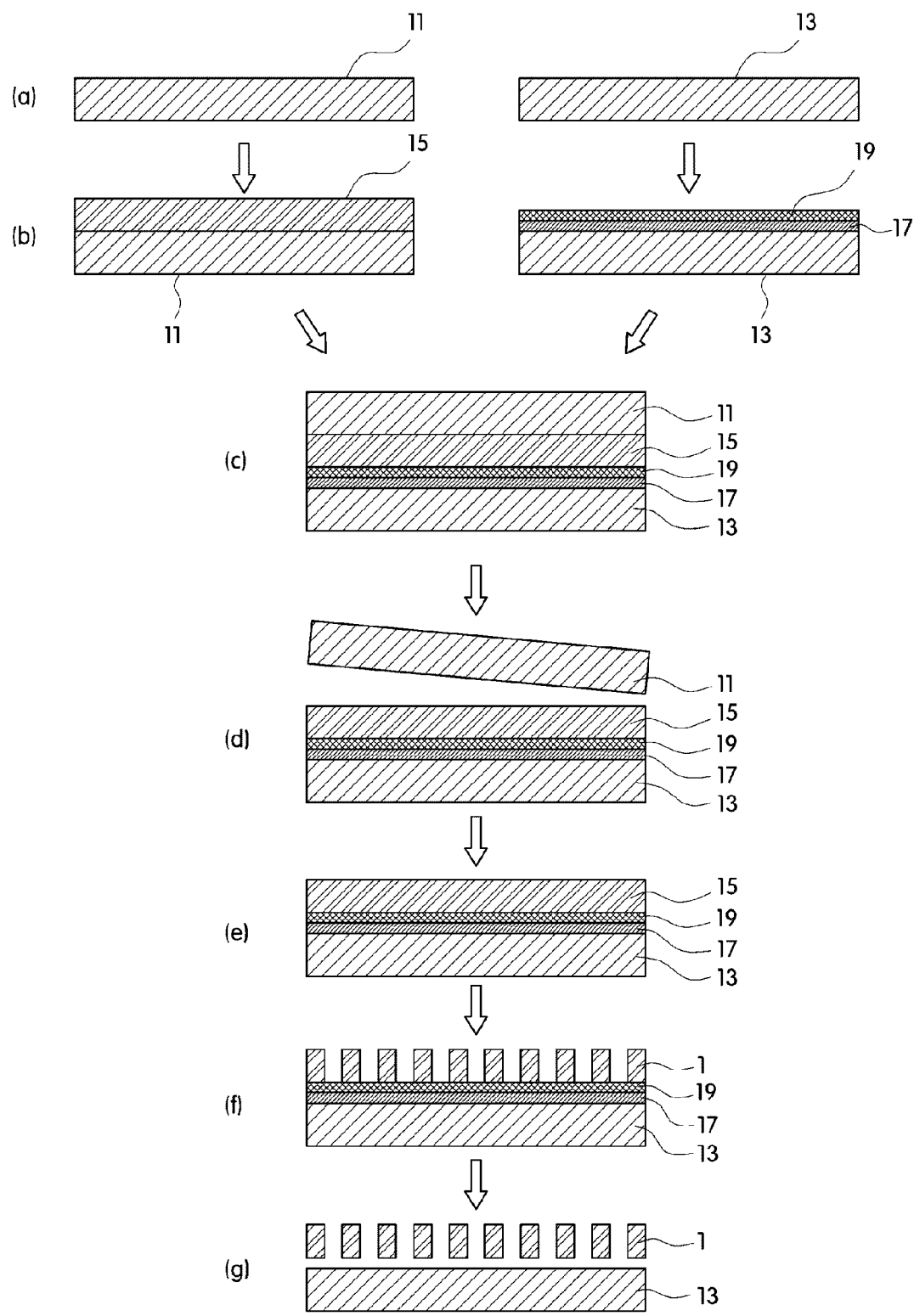
FIGS. 2A to 2G are cross-sectional views sequentially illustrating a process of producing a nanorod using the nanorod production method according to one embodiment of the present invention.

Referring to FIGS. 1 and 2A, in the providing of the growth substrate and the support substrate (S10), a growth substrate 11 is provided to grow a nanomaterial layer 15 and the support substrate 13 is provided to support and form sacrificial layers 17 and 19.

Meanwhile, referring to FIG. 2A, the growth substrate 11 may include at least one among a glass substrate, a quartz substrate, a sapphire substrate, a plastic substrate, and a bendable flexible polymer film. Further, the growth substrate may include a transmissive substrate.

In this case, the growth substrate may include at least one among gallium nitride (GaN), silicon carbide (SiC), zinc oxide (ZnO), silicon (Si), gallium phosphide (GaP), spinel ($MgAl_2O_4$), magnesium oxide (MgO), lithium aluminate ($LiAlO_2$), lithium gallate ($LiGaO_2$), gallium arsenide (GaAs), aluminum nitride (AlN), indium phosphide (InP), and copper (Cu). However, the growth substrate 11 is not limited as long as the nanomaterial layer 15 can be epitaxially grown thereon.

Meanwhile, referring to FIG. 2A, the support substrate 13 may include one among a sapphire substrate, a glass substrate, a silicon carbide substrate, a silicon substrate, and a conductive substrate made of a metal material. Further, the support substrate 13 may include a circuit board such as a printed circuit board (PCB) or a ceramic substrate containing a ceramic.

Referring to FIGS. 1 and 2B, in the epitaxial growing of the nanomaterial layer on one surface of the growth substrate (S20), the nanomaterial layer 15 which is a material of the nanorod 1 may be epitaxially grown on one surface of the growth substrate 11.

In this case, the epitaxial growing of the nanomaterial layer on one surface of the growth substrate (S20) may include controlling a length of the nanorod by adjusting a deposition thickness of the nanomaterial layer (S21).

Further, as shown in FIG. 2B, the epitaxial growing of the nanomaterial layer on one surface of the growth substrate (S20) may include epitaxial growing the nanomaterial layer 15 on an upper surface of the growth substrate 11.

At this point, the epitaxial growth refers to a growth of a crystal of a same material or a different material on the particular crystal substrate in a specific direction, and the epitaxial growth is referred to as epitaxy.

Further, a growth of a crystal of a same material on the substrate is referred to as homoepitaxy or simply referred to as EPI, whereas a growth of a crystal of a material, which is different from a material of a substrate, on the substrate is referred to as heteroepitaxy.

Meanwhile, the nanomaterial layer 15 is a nano material constituting the nanorod 1, and the nanomaterial layer 15 may be made of one among ZnO, GaN, GaAs, SiC, tin oxide ($SnO_2$), GaP, zinc selenide (ZnSe), molybdenum disulfide ($MoS_2$), and Si, but the present invention is not limited thereto.

In one embodiment of the present invention, the nanomaterial layer 15 may be made of any kind of nanomaterial which can be vertically grown and constitute a nanorod having a large aspect ratio.

Meanwhile, referring to FIG. 1, vapor deposition used in the epitaxial growing of the nanomaterial layer on one surface of the growth substrate (S20) may include at least one among atomic layer deposition (ALD), reactive sputtering, ion implantation, magnetron sputtering, laser ablation, ion beam deposition, chemical vapor deposition (CVD), and plasma enhanced CVD.

However, metal organic CVD (MOCVD) may be preferably used for the epitaxial growth according to one embodiment of the present invention. That is, the nanomaterial layer 15 may be epitaxially grown using an MOCVD apparatus.

In this case, a compound having an alkyl group such as methyl or ethyl may be used as a raw material of an organometallic compound, such as trimethylgallium (Ga ($CH_3)_3$), trimethylaluminum ($Al(CH_3)_3$), and triethyl phosphate ($(C_2H_5O)_3PO$), used in the MOCVD apparatus.

Meanwhile, the nanomaterial layer 15 is a layer for forming the nanorod 1 through a subsequent process. In one embodiment of the present invention, in the controlling of the length of the nanorod by adjusting the deposition thickness of the nanomaterial layer (S21), a thickness of the nanomaterial layer 15 corresponds to a length of the nanorod 1 formed in the subsequent process so that a deposition thickness of the nanomaterial layer 15 is controlled to adjust the length of the nanorod 1.

Although not shown in the drawing, a buffer layer (not shown) required for the epitaxial growth may further be formed between the growth substrate 11 and the nanomaterial layer 15 in one embodiment of the present invention. At this point, the buffer layer may be formed to minimize a lattice mismatch between the growth substrate 11 and the nanomaterial layer 15.

Referring to FIGS. 1 and 2B, in the forming of the sacrificial layer on one surface of the support substrate (S30), a sacrificial layer may be formed on one surface of the support substrate 13, e.g., on an upper surface of the support substrate 13 as shown in FIG. 2B.

At this point, in one embodiment of the present invention, the sacrificial layer may include the metal layer 19 and the insulating layer 17 and may be made of a metal, an oxide, or a nitride such as gold (Au), titanium (Ti), iron (Fe), silicon oxide ($SiO_2$), or silicon nitride (SiN), but the present invention is not limited thereto.

Further, the sacrificial layer may be deposited as a thin metal layer 19 on an insulating layer to bond the nanomaterial layer 15 to the insulating layer 17.

Alternatively, when the sacrificial layer is formed on the upper surface of the support substrate 13, a bonding layer (not shown) may be provided on the upper surface of the support substrate 13 to bond the support substrate 13 to the sacrificial layer, but when the sacrificial layer is configured with a structure or a material capable of being bonded to the support substrate 13 without the bonding layer, the bonding layer may be omitted.

Referring to FIGS. 1 and 2C, in the bonding of the nanomaterial layer to the sacrificial layer (S40), the nanomaterial layer 15 is bonded to the insulating layer by bonding an upper surface of the nanomaterial layer 15 to an upper surface of the metal layer 19.

The metal layer 19 and the insulating layer 17, which are the sacrificial metal layer, may be etch stop layers when the resultant nanomaterial layer is etched to form a nano node. Therefore, an etchant for the nanomaterial layer 15 should be prevented from infiltrating into the support substrate 13.

Meanwhile, referring to FIGS. 1 and 2D, in the separating of the growth substrate from the nanomaterial layer (S50), the growth substrate 11 is separated from the nanomaterial layer 15.

At this point, a method of separating the growth substrate 11 from the nanomaterial layer 15 may include a laser lift-off (LLO) method, a chemical lift-off (CLO) method, and an electrochemical lift-off (ELO) method.

The LLO method is a method of growing the nanomaterial layer 15 on the growth substrate 11, bonding the sacrificial layer 17 onto the nanomaterial layer, and separating the nanomaterial layer from the growth substrate 11 by irradiating a laser beam.

The CLO method is a method of growing the sacrificial layer on the growth substrate 11, growing the nanomaterial layer 15, bonding the sacrificial layer onto the nanomaterial layer 15, and separating the nanomaterial layer 15 from the growth substrate 11 using an etchant. At this point, the etchant selectively etches the sacrificial layer.

The ELO method grows the nanomaterial layer 15 on the growth substrate 11 and forms a porous nanomaterial layer 15 through electrochemical etching using a metal anode. Then, the ELO method regrows the nanomaterial layer 15, bonds the sacrificial layer onto the nanomaterial layer, and separates the nanomaterial layer from the growth substrate.

In the flattening of the nanomaterial layer (S60), flattening may be performed by a chemical mechanical polishing (CMP).

Meanwhile, referring to FIGS. 1 and 2E, in the forming of the nanorod by etching the nanomaterial layer (S70), the nanomaterial layer 15 is selectively etched by the etchant with or without injecting the etchant to form the nanorod 1.

In this case, a mask material layer which is selectively etched with the nanomaterial layer 15 is formed, and the mask material layer may be formed as an insulating layer made of $SiO_2$ or SiN, but the present invention is not limited thereto.

At this point, the etchant may include sulfuric acid, phosphoric acid, potassium hydroxide, or sodium hydroxide. Meanwhile, the nanomaterial layer 15 is dry-etched in a top-down method to form the nanorod 1 which is vertically grown.

The top-down method is a method of implementing a display in a one-to-one correspondence manner in which a single micro light emitting diode (LED) element, which is manufactured in a top-down manner, is disposed at a position of a sub-pixel of a large-area glass substrate. However, one end portion of the nanorod 1 is bonded to the sacrificial layer.

Here, an etching gas used for the dry etching may include chlorine ($Cl_2$) or a hydrocarbon ($CH_4$) based gas, but the present invention is not limited thereto. In one embodiment of the present invention, when the nanomaterial layer 15 is etched with the etchant, the sacrificial layer serves as an etch stop layer that is not etched by the etchant.

Alternatively, the etching process may be performed by dry etching or wet etching. In this case, unlike wet etching, dry etching allows unidirectional etching, while wet etching allows isotropic etching so that etching may be performed in any direction.

Referring to FIGS. 1 and 2F, in the separating of the nanorod by removing the sacrificial layer (S80), the nanorod 1 is easily separated from the support substrate 13 by removing the sacrificial layer bonded to one end portion of the nanorod 1.

Consequently, the nanorod production method according to one embodiment of the present invention can minimize a defective rate of the nanorod and produce a high quality nanorod.

In this case, when the sacrificial layer is made of $SiO_2$, which is the insulating layer 17, the sacrificial layer may be removed using a buffered oxide etchant (BOE).

At this point, hydrofluoric acid (HF) of the etchant selectively reacts with $SiO_2$ or SiN to form silicon tetrafluoride ($SiF_4$) such that the sacrificial layer is removed.

When the sacrificial layer is the metal layer 19, the sacrificial layer may be removed using a metal etchant. At this point, a method of removing the sacrificial layer through etching may remove the sacrificial layer by immersing the support substrate in the BOE.

A nanorod production method and a nanorod produced thereby according to an exemplary embodiment of the present invention include a sacrificial layer such that a defective rate of a nanorod can be minimized by easily separating the nanorod during a process of separating the nanorod from a support substrate, thereby producing a high quality nanorod.

Hereinbefore, although one embodiment of the present invention has been described, the spirit of the present invention is not limited to the embodiment disclosed herein, and it should be understood that numerous other embodiments can be devised by those skilled in the art that will fall within the same spirit and scope of this disclosure through addition, modification, deletion, supplement, and the like of a component, and also these other embodiments will fall within the spirit and scope of the present invention.

INDUSTRIAL APPLICABILITY

In accordance with one embodiment of the present invention, there are provided a nanorod production method capable of minimizing a defective rate of a nanorod and producing a high quality nanorod, and a nanorod produced thereby.

The invention claimed is:

1. A method of manufacturing a nanorod, the method comprising:
providing a growth substrate and a support substrate;
epitaxial growing a nanomaterial layer on one surface of the growth substrate;
forming a sacrificial layer on one surface of the support substrate;
bonding the nanomaterial layer to the sacrificial layer;
separating the growth substrate from the nanomaterial layer;
flattening the nanomaterial layer;
etching the nanomaterial layer to form a nanorod; and
separating the nanorod by removing the sacrificial layer.

2. The method of manufacturing a nanorod of claim 1, wherein the growth substrate includes at least one among a glass substrate, a quartz substrate, a sapphire substrate, a plastic substrate, and a bendable flexible polymer film.

3. The method of manufacturing a nanorod of claim 1, wherein the growth substrate includes at least one among gallium nitride (GaN), silicon carbide (SiC), zinc oxide (ZnO), silicon (Si), gallium phosphide (GaP), spinel ($MgAl_2O_4$), magnesium oxide (MgO), lithium aluminate ($LiAlO_2$), lithium gallate ($LiGaO_2$), gallium arsenide (GaAs), aluminum nitride (AlN), indium phosphide (InP), and copper (Cu).

4. The method of manufacturing a nanorod of claim 1, wherein the support substrate includes at least one among a sapphire substrate, a glass substrate, a silicon carbide substrate, a silicon substrate, and a conductive substrate made of a metal material.

5. The method of manufacturing a nanorod of claim 1, wherein the nanomaterial layer includes at least one among zinc oxide (ZnO), gallium nitride (GaN), gallium arsenide (GaAs), silicon carbide (SiC), tin oxide ($SnO_2$), gallium phosphide (GaP), indium phosphide (InP), zinc selenide (ZnSe), molybdenum disulfide ($MoS_2$), and silicon (Si).

6. The method of manufacturing a nanorod of claim 1, wherein the nanomaterial layer is epitaxially grown by metal organic chemical vapor deposition (MOCVD).

7. The method of manufacturing a nanorod of claim 6, wherein the epitaxial growing of the nanomaterial layer on one surface of the growth substrate includes controlling a length of the nanorod by adjusting a deposition thickness of the nanomaterial layer.

8. The method of manufacturing a nanorod of claim 1, wherein the sacrificial layer includes an insulating layer for bonding to the nanomaterial layer and a metal layer deposited on an upper surface of the insulating layer to bond the insulating layer.

9. The method of manufacturing a nanorod of claim 8, wherein the sacrificial layer is made of gold (Au), titanium (Ti), iron (Fe), silicon oxide ($SiO_2$), or silicon nitride (SiN).

10. The method of manufacturing a nanorod of claim 1, wherein the separating of the growth substrate from the nanomaterial layer includes separating the growth substrate from the nanomaterial layer using one among a laser lift-off (LLO) method, a chemical lift-off (CLO) method, and an electrochemical lift-off (ELO) method.

11. The method of manufacturing a nanorod of claim 10, wherein the flattening of the nanomaterial layer includes flattening the nanomaterial layer separated from the growth substrate using chemical mechanical polishing (CMP).

12. The method of manufacturing a nanorod of claim 9, wherein, when the sacrificial layer is made of $SiO_2$, the separating of the nanorod by removing the sacrificial layer includes removing the sacrificial layer using a buffered oxide etchant (BOE).

13. The method of manufacturing a nanorod of claim 9, wherein, when the sacrificial layer is made of a metal layer, the separating of the nanorod by removing the sacrificial layer includes removing the sacrificial layer using a metal etchant.

* * * * *